United States Patent [19]

Juan et al.

[11] Patent Number: 4,835,846
[45] Date of Patent: Jun. 6, 1989

[54] METHOD OF MANUFACTURE OF ELECTRONIC MODULES FOR CARDS WITH MICROCIRCUITS

[75] Inventors: Alain Juan, Chézard; Jean-Claude Vuilleumier, Cressier, both of Switzerland

[73] Assignee: EM Microelectronic Marin SA, Marin, Switzerland

[21] Appl. No.: 243,857

[22] Filed: Sep. 13, 1988

[30] Foreign Application Priority Data

Sep. 14, 1987 [FR] France ............................. 87 12739

[51] Int. Cl.4 ............................................. H05K 3/39
[52] U.S. Cl. ......................................... 29/840; 20/827;
174/52.4; 235/488; 235/492; 361/398
[58] Field of Search ................... 361/398; 174/52 FP;
235/488, 492; 428/901; 29/827, 840

[56] References Cited

U.S. PATENT DOCUMENTS

| 4,042,861 | 8/1977  | Yasuda et al. ................. 361/398 X |
| 4,460,825 | 7/1984  | Haghiri-Tehrani et al. ... 174/52 FP X |
| 4,463,971 | 8/1984  | Hoppe et al. ................. 235/492 X |
| 4,514,785 | 4/1985  | Parmentier ................. 174/52 FP X |
| 4,549,247 | 10/1985 | Hoppe et al. ............... 174/52 FP X |
| 4,550,248 | 10/1985 | Hoppe et al. ..................... 235/492 |
| 4,552,383 | 11/1985 | Hoppe et al. ................. 235/488 X |
| 4,603,249 | 7/1986  | Hoppe et al. ..................... 235/492 |
| 4,617,216 | 10/1986 | Haghiri-Tehrani et al. ... 428/901 X |
| 4,617,605 | 10/1986 | Obrecht et al. ............... 235/488 X |
| 4,674,175 | 6/1987  | Stampfli ....................... 235/488 X |
| 4,709,254 | 11/1987 | Haghiri-Tehrani et al. ......... 357/72 |
| 4,727,246 | 2/1988  | Hara et al. ..................... 361/398 X |
| 4,746,392 | 5/1988  | Hoppe ............................. 29/827 X |
| 4,774,633 | 9/1988  | Dehaine et al. .................... 361/398 |

FOREIGN PATENT DOCUMENTS

| 3248385 | 6/1984  | Fed. Rep. of Germany . |
| 2439438 | 10/1978 | France . |
| 2081644 | 2/1982  | United Kingdom ................. 428/901 |

Primary Examiner—Carl J. Arbes
Attorney, Agent, or Firm—Griffin, Branigan & Butler

[57] ABSTRACT

The card with microcircuits of this invention includes an electronic module having standardized electrodes. To make up this module a first unit is fabricated including a first insulating substrate covered by the electrodes. Under each electrode is located a first hole. Next there is fabricated a second unit which includes an integrated circuit chip the connection terminals of which are coupled to conductors printed onto a second insulating substrate. One of the free ends of each conductor falls directly over a second hole provided in the second insulating substrate. The arrangement is such that the first hole is coaxial with the second hole corresponding thereto when the units are superposed. The two units are then assembled by superposing them and soldering the free ends of the conductors of the second unit to the electrodes of the first unit by introducing a soldering tool into the second hole. The module is employed in particular in a microcircuit card of standardized dimensions.

11 Claims, 4 Drawing Sheets

METHOD OF MANUFACTURE OF ELECTRONIC MODULES FOR CARDS WITH MICROCIRCUITS

This invention concerns a method of manufacture of an electronic module, in particular for cards with microcircuits, such module including a plurality of electrodes intended to come into contact with an apparatus into which the card is introduced, at least one integrated circuit chip exhibiting a front face provided with connection terminals and a back face, and a set of conductors coupling said electrodes to the connection terminals of the chip.

BACKGROUND OF THE INVENTION

As far as they are presently known, the electronic modules intended to equip transaction cards appear generally in the form of a wafer designed to be incorporated into a corresponding opening of the card body located in a corner of the latter and including a memory and an integrated microprocessor in the form of a single chip or two chips connected together by electrical conductors, a set of contact pads, often to the number of eight, coupled solely to the microprocessor and an insulating body in which are concealed all the other elements with naturally the exception of the conductive pads or electrodes which must be made accessible for the connection members of an apparatus, for instance a computer terminal in which the card is intended to be introduced. In certain cases the insulating body which defines the form of the wafer and which assures protection of the elements which it surrounds comprises a support portion and a covering portion, in others it comprises a homogeneous encapsulation.

On the other hand independently from the questions connected with the integrated circuit itself, as for instance those of knowing which information the memory must stock, which functions the microprocessor must perform and in which manner such memory and microprocessor must be conceived, the preparation of the electronic modules gives rise to a certain number of problems in view of the numerous demands to which they must respond.

Initially, a microcircuit card for payments must have the same format as the well-known card having standardized magnetic tracks, the length of which is 85 mm, the width 54 mm and the thickness 0.76 mm (ISO standards) or at least dimensions close thereto in order to avoid bulkiness and to be readily manipulated.

If one takes into account that initially a thickness of 760 microns corresponds roughly only to only twice that of an integrated circuit chip without protection, that secondly the portion of the card surface which can be allocated to the electronic unit is very limited, being given that the major portion of such surface must be reserved to inscriptions such as the designation of the party issuing the card, identity of the bearer, a signature, information concerning utilization and eventually a photo and that, thirdly, the conductive pads must be sufficiently large in order that the contact with the connection members of the apparatus be assured and good, it will be readily and rapidly seen that one may not use standardized circuits already encapsulated or encased such as those which are presently found on the market and which are much too voluminous.

One is thus oneself obliged, in order to manufacture the electronic modules from bare integrated circuit chips, to provide the network of interconnections which enables electrically connecting these chips with the exterior and among themselves if there should be several in the same module and to assure the protection of the assembly which is naturally very fragile, above all at the junctions between the conductive portions (connection terminals of the chip, wires, etc.).

It is necessary furthermore to avoid that external agents such as light or humidity cause deterioration of the circuit or disturb the operation thereof.

It will likewise be noted that the cards must be such as to be adapted to mass production and at a very low manufacturing cost, above all for cards in which a certain value is initially entered which one pays when buying them and which when this value has been exhausted must simply be thrown away.

The conductive pads or electrodes likewise form the object of standards as to their positions on the card, the maximum dimensions which their surfaces may present and finally the functions which may be attributed to them. On this subject one may readily consult the project of ISO standard No. 7816/2.2 established by the technical committee TC 97. In this document there are assigned to the eight electrodes designated from C1 to C8 precisely defined functions, for instance to electrode C1 the energization voltage VCC, to electrode C3 the clock signal CLK, to electrode C5 the ground GND and to electrode C7 the input and output data I/O. It will be readily understood that this order is not necessarily going to correspond to that which has been chosen for the chip to be employed, in such a manner that perhaps it may be necessary to envisage detours of the conductors coupling said electrodes to the connection terminals of the chip. At least one embodiment of the electronic module according to the present invention should enable these detours in order to adapt a chip having connection terminals arranged according to any order whatsoever to the electrodes of a standardized electronic module.

As in the present invention, the module described in document DE-A No. 3 248 385 comprises two units. The first unit includes a first substrate onto which are imprinted the electrodes on the visible face, the opposite face of the substrate bearing metallizations coupled to the electrodes by means of metallized holes. The second unit comprises a second substrate and metallized conductors intended to couple the terminals of a chip to the metallization borne by the first substrate. Under each of these conductors there is pierced an opening thanks to which it is possible to solder the conductor to the corresponding metallization of the first substrate. It is noted however that these conductors cover entirely and even greatly exceed the openings pierced underneath them in a manner such that they exhibit no free and movable end which would be capable of being soldered to a surface electrode of a first substrate which would be provided with an underlying hole such as that shown for instance in the document FR-A No. 2 439 438. Contrary to this and as will appear subsequently, the present invention proposes printed conductors which present extremities capable of being bent in a manner such that they may be introduced into holes giving access to the electrodes of the module, then soldered to these electrodes.

The purpose of the invention is to provide a satisfactory solution to the different problems which have been evoked hereinabove.

SUMMARY OF THE INVENTION

In conformity with the invention, the method of manufacture of the electronic module is characterized by the following steps: fabricating a first unit including an insulating substrate bearing a plurality of electrodes, each electrode overlaying a hole provided in the substrate; fabricating a second unit by the successive operations of obtaining an integrated circuit chip and an insulating substrate, coating the substrate with adhesive material, forming a rectangular opening in the substrate of dimensions slightly greater than the peripheral dimensions of the chip, perforating the substrate with second holes corresponding in number to the first mentioned holes provided in the first unit, said second holes being arranged to be substantially coaxial to the first holes when said first and second units are superposed, applying a metallic leaf onto said adhesive material, chemically engraving said leaf so as to form a network of conductors in a manner such that one of the first free ends of each of said conductors falls directly over a connection terminal of the chip and that each of the second free ends of each of said conductors falls directly over a corresponding second hole of the second unit, introducing the front face of said chip into said rectangular opening from below the substrate, soldering the chip onto said first free ends of said conductors, coating with glue either the face of the second unit bearing the conductors or the back face of the first unit, applying the first unit to the second unit so that the holes of said first unit are turned towards the conductors borne by the second unit and introducing the conductors of the second unit into the respective holes of the first unit and soldering said conductors to the corresponding electrodes borne by said first unit.

Other characteristics and advantages of the invention will appear in the course of the detailed, but non limiting description to follow and which gives two possible methods which may be employed. This description will be made having reference to the attached drawings.

DESCRIPTION OF THE PREFERRED EMBODIMENTS

Figure 1:
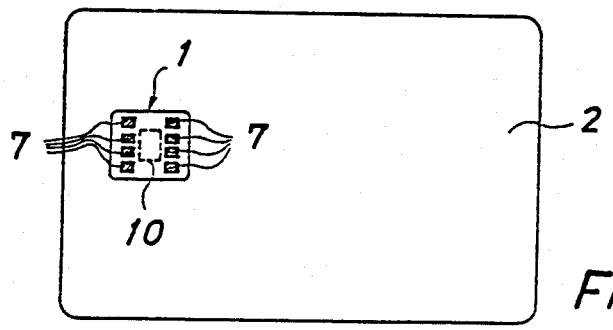
FIG. 1 shows a plan view of the general appearance of a micro-circuit card comprising an electronic module encased in a support.

FIG. 1 shows a plan view of a microcircuit card including an electronic module 1 enclosed in a support 2. As has already been said above, support 2 is standardized as to its dimensions. The electronic module includes eight electrodes 7 the dimensions of which and the location relative to the edges of the card and the functions are likewise standardized. Each electrode 7 is a rectangle the minimum dimensions of which are $2.0 \times 1.7$ mm. In the most usual cases the integrated circuit chip 10 is located between the electrodes 7 under the insulating substrate which bears said electrodes. The electrodes are intended to come into electrical contact with an apparatus into which the card is introduced. A set of conductors, not shown, on FIG. 1 but which will be subsequently described, connects the electrodes to the connection terminals of the chip.

The present invention describes a manner of fabricating the electronic module 1, a possible manner of enclosing the module within the support 2 being suggested only at the end of this description, this in order to make it as complete as possible.

Figure 2D:
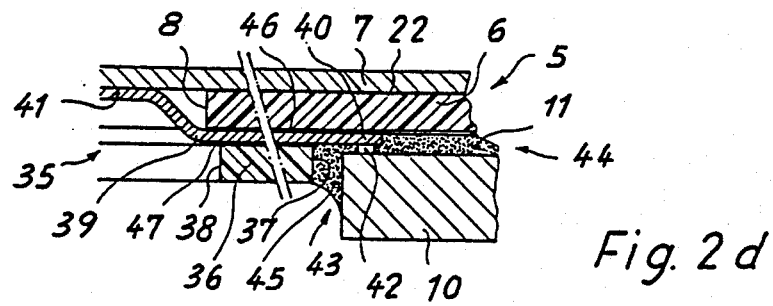
FIG. 2d shows at a highly enlarged scale the zone B bounded by the dotted line of FIG. 2c, FIGS. 2a to 2d representing a principal embodiment of the invention.
Figure 2A:
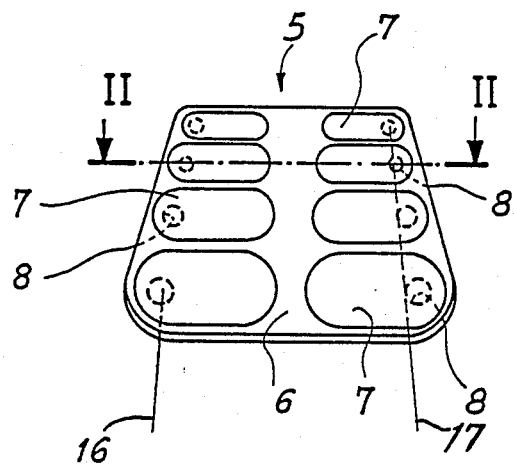
FIG. 2a shows in perspective the first unit of which the electronic module is composed such unit being provided with electrodes.

According to the invention, one begins by manufacturing a first unit such as has been shown in perspective on FIG. 2a. This first unit includes an insulating substrate 6 covered over by a plurality of electrodes 7 the surface of which covers at least the standardized area discussed having reference to FIG. 1. Each electrode 7 initially covers a hole 8 provided in the substrate 6. Several methods may be employed in order to manufacture this first unit, two of which will now be described.

Figures 3A, 3B:
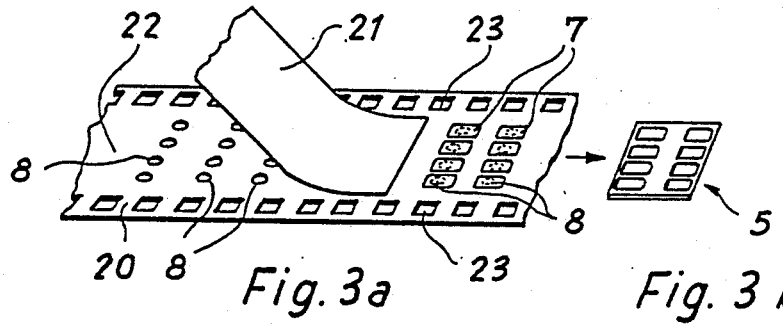

A first method of manufacture is shown on FIGS. 3a and 3b which employ a film for mass production. This could however be a piece by piece fabrication in which case one would have as many substrates as parts.

One obtains a film exhibiting an insulating support 20 as shown on FIG. 3a formed of polyimide, polyester or an epoxy glass (thickness on the order of 125 $\mu$m). One coats the substrate 20 with an adhesive material 22 the thickness of which may vary between 25 and 35 $\mu$m. Next one perforates the substrate thus coated with a number of holes 8 corresponding to the number of electrodes 7 which the first unit 5 is to bear once terminated (see FIG. 2a). One then applies a metallic leaf 21 (thickness between 35 and 70 $\mu$m) by rolling it on to the substrate 20 which adheres strongly because of the layer of glue 22. Next one chemically engraves the said leaf according to a procedure similar to that which is employed for manufacturing printed circuits so as to obtain the field of electrodes 7 the arrangement being such that each electrode 7 covers a hole. Finally, if the first unit is formed on film as is the case in FIG. 3a, one cuts out the first unit of the film 20 in order to obtain the part 5 shown on FIG. 3b.

FIG. 3a shows a 35 mm film having standardized perforations 23. In view of the likewise standardized dimensions of the electrodes 7, one will be able to accommodate two first units within the width of the film, although the figure shows only one, simply in order better to detail the method of fabrication.

One may criticize the method which has just been described because of its relatively high cost arising from photolithographic machining. Additionally, this type of machining includes a stage of chemical attack of the metal by a solvent which brings about a heavy ionic pollution of the insulating substrate. Such pollution, which even appropriate cleaning may not totally eliminate, has as effect to diminish the reliability over the long term of the units.

Figure 4A:
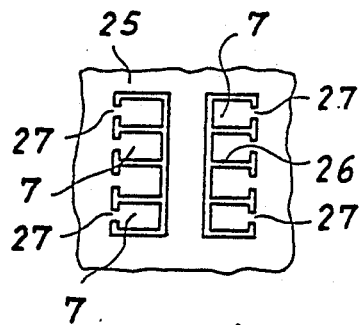
FIGS. 3a and 3b and FIGS. 4a, 4b and 4c show respectively two different methods of obtaining the first unit of the electronic module.
Figure 4B:
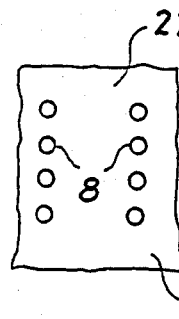
Figure 4C:
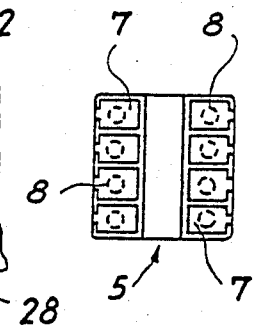

To overcome these difficulties, one may employ a second method of manufacture of this first unit and which will now be set forth illustrated by FIGS. 4a to 4c.

In this method one procures a metallic leaf 25. The electrodes 7 are formed thereon by stamping or by chemical engraving as is shown on FIG. 4a, the electrodes being separated from one another by separations 26 but remain connected to the leaf by bridges 27 in order to maintain the whole unified. One likewise obtains an insulating substrate 28 which is coated with adhesive material 22 (FIG. 4b). One next perforates the thus coated substrate with a number of holes 8 corresponding to the number of electrodes 7 borne by the first unit 5 following its manufacture. One then applies the leaf 25 (FIG. 4a) onto substrate 28 (FIG. 4b) taking care that each electrode 7 is placed so as to cover a corresponding hole 8. Finally, the assembly thus formed is stamped out whilst arranging at the same time to cut the bridges 27. One then obtains the first unit 5 shown on FIG. 4c.

It will be noted that the first unit thus obtained may likewise be mass-produced on standardized films, in the manner described with reference to FIG. 3b.

Figure 2B:
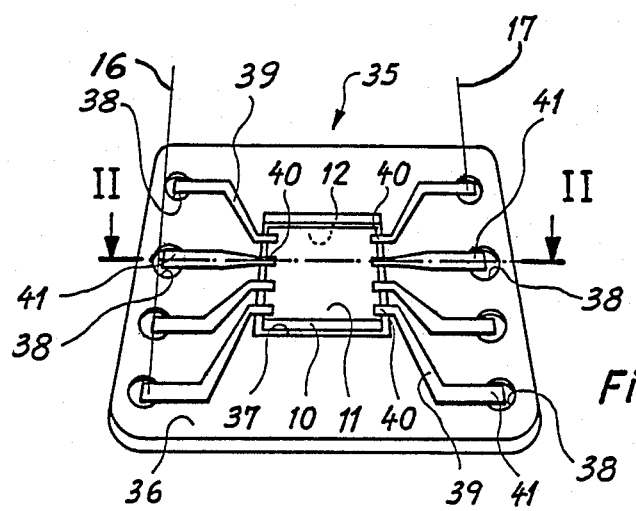
FIG. 2b shows in perspective the second unit of which the electronic module is composed, such unit being provided with a micro-circuit chip.

Next one fabricates a second unit 35 the final appearance of which is shown in perspective on FIG. 2b. This second unit includes an insulating support 36 in which is provided a rectangular opening 37 the dimensions of which are slightly greater than the peripheral dimensions of an integrated circuit chip 10 which is to be placed within said opening 37. Support 36 is further pierced by a plurality of second holes 38 corresponding to the first holes 8 provided in the first unit 5, these second holes being arranged so as to be substantially coaxial to the first when the first and second units are superimposed on one another. This coincidence of construction is shown on the drawing by two lines 16 and 17. The support or insulating substrate 36 likewise bears a plurality of conductors 39 of which the first free ends 40 of each thereof falls directly over a connection terminal of the chip (not shown on FIG. 2b) and of which each of the second free ends 41 falls directly over a second hole 38. Chip 10 which exhibits a front face 11 provided with connection terminals and a back face 12 which has none is introduced into the opening 37 and its connection terminals are soldered to the first free ends 40 of conductors 39.

As soon as the two units have been produced one coats with glue either the face of the second unit which bears the conductors or the back face of the first unit. One applies the first unit 5 onto the second unit 35, the holes of the first facing towards the conductors 39 of the second unit 35 which have the second ends 41 bent into a corresponding hole 8 of the first unit 5 and one solders each of these ends 41 to a corresponding electrode 7.

Figure 2C:
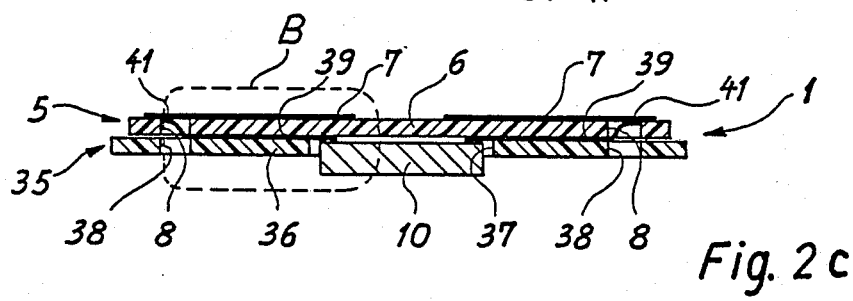
FIG. 2c shows a cross-section of the electronic module assembled, such cross-section being according to lines II—II of FIGS. 2a and 2b supposing the two units to be superposed.

One then obtains the electronic module shown on FIG. 2c. This figure leads one to understand moreover the reason for the second holes 38 by which may be introduced the soldering tool for the conductors.

The assembly which has just been described appears more clearly on FIG. 2d which shows at an enlarged scale the zone B bounded in dotted lines on FIG. 2c. One sees there the first unit 5 provided with its substrate 6 and an electrode 7 between which is apparent a layer of glue 22. In the first hole 8 there penetrates the second end 41 of the conductor 39. This end is soldered to the electrode 7. The first end 40 of the conductor 49 is soldered onto a connection terminal 42 of the front face 11 of the chip 10.

FIG. 2d further shows that the free space 43 formed between the peripheral edge of the chip 10 and the rectangular opening 37 in which the chip is placed as well as the space 44 formed between conductors 39 and the front face of the chip is filled with a resinous compound 45 applied in order to rigidify the assembly of the chip 10, the substrate 36 and conductors 39. The same figure shows also an extremely thin glue layer 46 serving to glue the first unit 5 to the second unit 35. In reality the majority of the glue will be located between conductors 39 at a place not visible on the drawing and one will give the conductor a form which will force the glue to flow to this place at the moment of application of the two units to one another, this with the purpose of reducing to a minimum the space taken up by the glue. FIG. 2d shows finally a glue layer 47 which results from the manufacture of the second unit.

Certain details remain to be given concerning the manner of fabricating the second unit 35 shown on FIG. 2. For this reference will be had to FIG. 5.

One obtains an insulating substrate 36 which is here shown in the form of a standardized 35 mm film. One coats the substrate with an adhesive matter 47. One perforates the substrate with the rectangular opening 37 and the second holes 38. One applies a metallic leaf 48 onto the adhesive material. Next, and as appears to the right of FIG. 5, the conductors 39 are formed by a photolithographic method. One then obtains an integrated circuit chip 10 and one solders the terminals of said chip to the first ends 40 of conductors 39. Finally, if the second unit is likewise realized on film which is the case shown on FIG. 5, one cuts out this second unit of the film in order to obtain the part 35 shown on FIG. 2b.

The network of conductors 39 being supported by an insulating substrate 36, a glue film 47 being interposed between each conductor and the substrate, one may refer to the product illustrated on FIG. 2b as a film of three layers.

Figure 5:
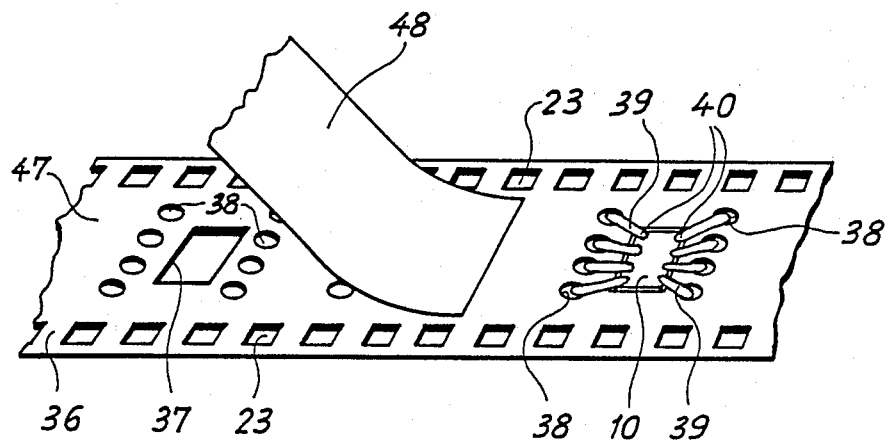
FIG. 5 shows how the second unit of the electronic module is obtained, such unit being shown on FIG. 2b.

FIG. 5 shows a 35 mm film having standardized perforations 23. For this type of film it will generally be possible to accommodate two second units within the width of the film, although the figure shows only one, this in order better to bring out the details of the manufacturing method.

Figure 6A:
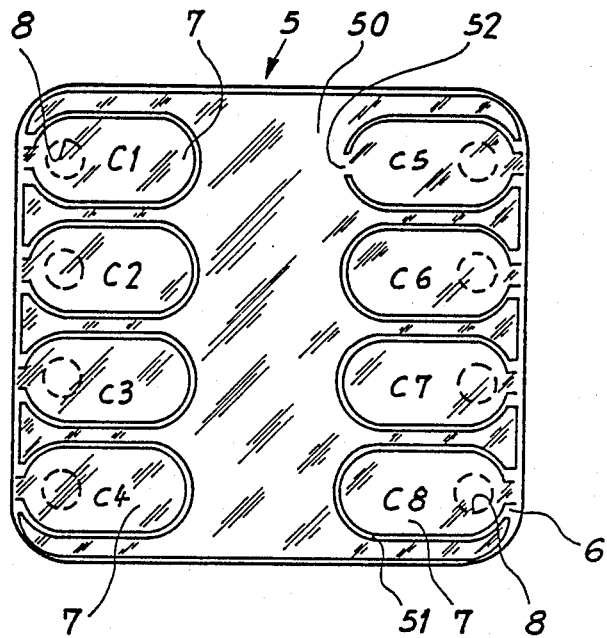
FIGS. 6a and 6b show in a view from above respectively a first unit and a second unit comprising an electronic module according to a working embodiment.
Figure 6B:
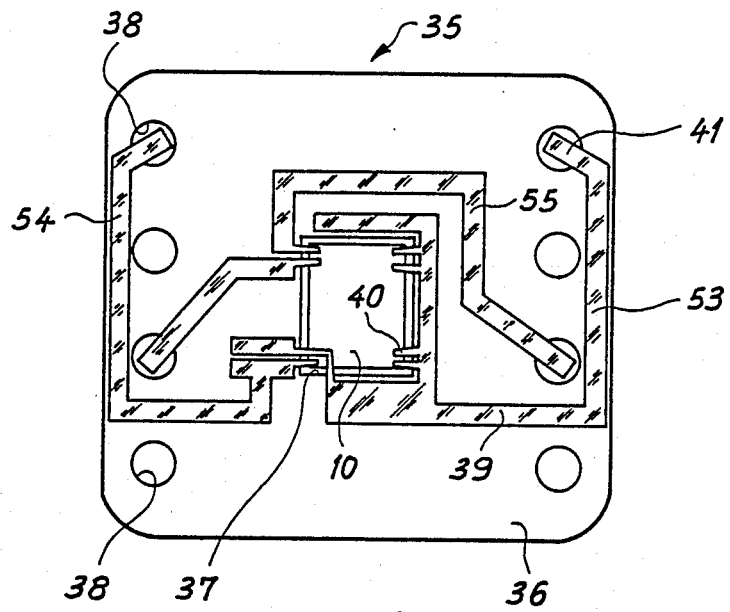

FIGS. 6a and 6b show respectively from above a practical embodiment of a first unit 5 and of a second unit 35 before their assembly and in accordance with the invention.

Electrodes 7 of unit 5 are identified by their references C1 to C8 according to the ISO standard mentioned in the introduction to the present description. These electrodes are at least equal in surface to the standardized surface; each covers a first hole 8. FIG. 6a shows that the zone 50 situated between the electrodes and as well between the two rows of electrodes is formed of the same metal as said electrodes, a space 51 without metal being provided in order to insulate the electrodes of said zone 50. Such zone 50 is electrically connected to the electrode C5 by a neck 52. This is intentionally sought after since the electrode C5 represents the ground of the chip which by this neck provides a shield for the chip.

The second unit 35 shown on FIG. 6b exhibits an exterior profile identical to the exterior profile of the first unit 5. Once superposed, the two units exhibit only a single edge (see also FIG. 7a). The second unit 35 is provided with a chip 10 the functions of the output terminals of which are not arranged in the same manner as those of the standardized electrodes of the module. One is then obliged to effect certain detours for the conductors 39, such detours being visible on FIG. 6b (for instance conductors 53, 54, 55). The invention shows the advantage of permitting such detours thanks to which one may employ a chip, the terminals of which are arranged in any manner whatsoever in order to equip an electronic module for which the electrodes are standardized.

Figures 7A, 7B, 7C:
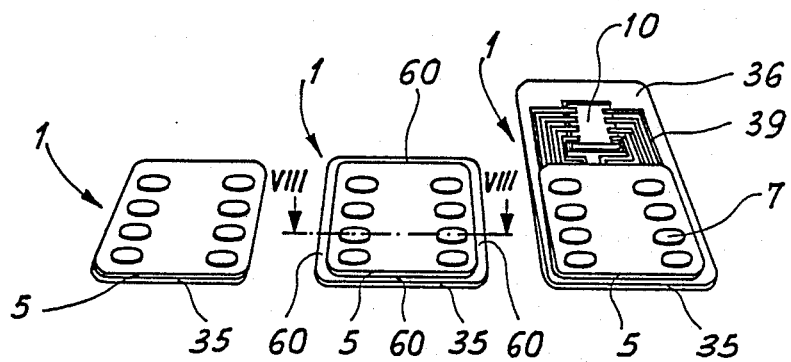
FIGS. 7a, 7b and 7c show in perspectives three electronic modules obtained according to the invention and in which the first and second units exhibit respectively surfaces and contours which are equal (FIG. 7a), different surfaces and similar contours (FIG. 7b), different surfaces and different contours (FIG. 7c)

FIGS. 7a, 7b and 7c show in perspective three completed electronic modules realized in accordance with the invention.

The electronic module 1 of FIG. 7a comprises the first unit 5 and the second unit 35. Although not visible on the drawing, the chip of unit 35 is arranged between two rows of second holes (as is visible on FIG. 2c). FIG. 7a shows that once superposed units 5 and 35 are placed edge to edge, which implies that the first and second units have the same surfaces and the same contours. In this case one will provide a housing of the same form and the same thickness as the module in the microcircuit card and one will glue the module into the card in the same manner as a stamp to a letter.

Figure 8:
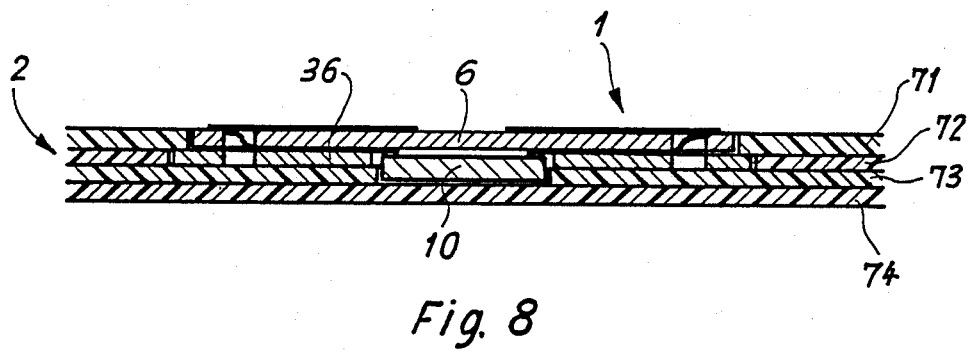
FIG. 8 is a cross-section according to line VIII—VIII of FIG. 7b showing how the electronic module of FIG. 7b may be introduced into a credit card for example.

It may however be feared that the module will separate too easily from the card if it is assembled therewith as proposed hereinabove. One may then produce a module according to FIG. 7b, the sole difference from the first proposed module consisting in having for the first unit 5 a smaller surface than that of the second unit 35, the contour of the two units being similar, in a manner such that the contour of the first unit is set back from the contour of the second, the module exhibiting a peripheral step 60. FIG. 8 shows how such a module may be assembled with a card if one establishes a cut along the line VIII—VIII on FIG. 7b. Here one finds module 1 of FIG. 2c with its first and second units. FIG. 8 shows that the card 2 consists of a superposition of layers pressed together and referenced 71, 72, 73 and 74. The layer 71 surrounds the first unit and its insulating substrate 6 and the layer 72 surrounds the insulating substrate 36 of the second unit. Layer 73 extends to the periphery of the chip 10 while layer 74 forms the sealing layer. Once the layers are pressed together it will be seen that the module 1 is solidly anchored into the card since the step 60 prevents any inopportune separation of the module. Here will be understood the reason for the glue layer 46 (see FIG. 2d), arranged between the two units. Without this the substrate 60, under mechanical forces, could be detached from the second unit.

It has been indicated to the present that the chip could be placed between the two rows of holes borne by the second unit. It may happen however that the chip is sufficiently large that it may not be housed in the space comprised between these rows. In this case a module will be manufactured such as is shown in FIG. 7c. Here the chip is arranged outside the space comprised between the two rows on a substrate 36 which projects beyond one side of the contour of the first unit 5 in a manner such that the chip is located outside the field covered by this first unit. The electrical connections between the chip and the electrodes 7 of the first unit 5 are brought about as described hereinabove by conductors 39 and the two units 5 and 35 are manufactured according to the same procedures as those which have been described hereinabove. It will be noted that the arrangement of FIG. 7c enables having in addition to the chip 10, a chip of standard dimensions which could be arranged between the rows of holes. The second unit 35 could then contain extra conductors in order to couple the two chips together electrically.

Certain of the figures accompanying the present description indicate mass production based on film. The film, generally of 35 mm, with standard perforations, is employed in practicing a well-known system, the so-called tape automated bonding which will be profitably employed in the present invention to obtain the first and second units necessary for the manufacture of the electronic module of the invention.

Finally, it will be mentioned that the first and second units are separately manufactured on their respective supports. Instead of detaching each of the units from its support just prior to assembly thereof, one could detach only the first unit from its support which is next brought to be assembled onto a second unit which remains attached to its support. The modules are then delivered in strips to the inserting machine which cuts them out and mounts them onto the cards. This manner of manufacture is elegant and rapid for the insertion work and does not necessitate any particular precautions, the module being well protected as may be seen from the present description.

In any manner, whether the modules are delivered part by part or mounted on film, they constitute a standard unit for the inserter which will no longer have to be concerned with particular wishes of customers, these wishes having already been satisfied by the manufacture of the electronic module.

It will be noted that the first unit 5 includes no piercing for the passage of the chip and thus this unit serves as protection of said chip from the outside. It will likewise be noted that the conductors 39 are located on the front face of the second unit 35 and are in contact with the back face of the first unit, this being important in order to obtain a reduced thickness of the module, on the one hand, and to facilitate manufacture of the second unit, on the other hand.

Finally, it will be noted that the figures shown here by way of example exhibit round holes for passage of the conductors. These holes could have another form, rectangular for example, without departing from the spirit of the present invention.

What we claim is:

1. A method of manufacture of an electronic module, in particular for a card provided with microcircuits, such module including a plurality of electrodes intended to come into contact with an apparatus into which the card is introduced, at least one integrated circuit chip exhibiting a front face provided with connection terminals and a back face and a set of conductors coupling said electrodes to the connection terminals of the chip, comprising the following steps:

fabricating a first unit including an insulating substrate bearing a plurality of electrodes, each electrode overlaying a hole provided in the substrate;

fabricating a second unit by the successive operations of:
(a) obtaining an integrated circuit chip and an insulating substrate,
(b) coating the substrate with adhesive material,
(c) forming a rectangular opening in the substrate of dimensions slightly greater than the peripheral dimensions of the chip,
(d) perforating the substrate with second holes corresponding in number to the first mentioned holes provided in the first unit, said second holes being arranged to be substantially coaxial to the first holes when said first and second units are superposed,
(e) applying a metallic leaf onto said adhesive material,
(f) chemically engraving said leaf so as to form a network of conductors in a manner such that one of the first free ends of each of said conductors falls directly over a connection terminal of the chip and that each of the second free ends of each of said conductors falls directly over a corresponding second hole of the second unit,
(g) introducing the front face of said chip into said rectangular opening from below the substrate,
(h) soldering the chip terminals onto said first free ends of said conductors,
(i) coating with glue either the face of the second unit bearing the conductors or the back face of the first unit, applying the first unit to the second unit so that the holes of said first unit are turned towards the conductors borne by the second unit, and introducing the conductors of the second unit into the respective holes of the first unit and soldering said conductors to the corresponding electrodes borne by said first unit.

2. A method as set forth in claim 1 wherein the first unit is fabricated by the successive operations of:
(a) obtaining an insulating substrate,
(b) coating the substrate with an adhesive material,
(c) perforating the substrate with holes corresponding in number to the electrodes borne by said first unit when its fabrication is complete,
(d) applying a metallic leaf onto said adhesive material,
(e) chemically engraving said electrodes in said leaf so that each overlays one of said holes.

3. A method as set forth in claim 1 wherein the first unit is fabricated by the successive operations of:
(a) obtaining an insulating substrate,
(b) coating the substrate with an adhesive material,
(c) perforating the substrate with holes corresponding in number to the electrodes borne by said first unit when its fabrication is complete,
(d) obtaining a metallic leaf,
(e) forming the electrodes in said leaf by stamping or by chemical engraving, each of said electrodes remaining attached to the leaf by a bridge so as to maintain an assembly,
(f) applying said leaf to said adhesive material covering said substrate so that each of the electrodes overlays one of said holes,
(g) stamping the thus formed assembly and at the same time severing said bridges thus to obtain said first unit.

4. A method as set forth in claim 1 wherein at least the free space formed between the peripheral edge of the chip and the rectangular opening into which it is introduced as well as between the conductors and the front face of the chip is filled with a compound serving to rigidify the assembly of the chip, the substrate and the conductors.

5. A method as set forth in claim 1 wherein the first and second units are mass produced on films and following termination are cut away from their respective films.

6. A method as set forth in claim 1 wherein the first and second units are mass produced on films and following termination the first unit is cut away from its film then applied to the second unit, this latter remaining attached to its film whereby the finished product is delivered in strips.

7. A method as set forth in claim 1 wherein said second holes are arranged in two parallel rows, said chip being situated in the space between said rows.

8. A method as set forth in claim 7 wherein the first unit exhibits a surface and contour corresponding to the surface and contour of the second unit so that upon superposition said units are edge to edge.

9. A method as set forth in claim 7 wherein the first and second units exhibit a similar contour, the surface of the first unit being smaller than that of the second unit so that following superposition of the first unit onto the second unit the contour of the first unit is inset from the contour of the second unit.

10. A method as set forth in claim 1 wherein said second holes are arranged in two parallel rows, said chip being situated outside the space between said rows.

11. A method as set forth in claim 10 wherein the surface of the first unit is smaller than the surface of the second unit whereby following superposition of said units the contour of the first unit is inset from the contour of the second unit and the chip is not covered by said first unit.

* * * * *